United States Patent  (10) Patent No.: US 8,255,758 B2
Anholt et al.  (45) Date of Patent: Aug. 28, 2012

(54) DECODING OF ERROR CORRECTION CODE USING PARTIAL BIT INVERSION

(75) Inventors: Micha Anholt, Tel Aviv (IL); Ofir Shalvi, Ra'anana (IL)

(73) Assignee: Apple Inc., Cupertino, CA (US)

( * ) Notice: Subject to any disclaimer, the term of this patent is extended or adjusted under 35 U.S.C. 154(b) by 862 days.

(21) Appl. No.: 12/355,817

(22) Filed: Jan. 19, 2009

(65) Prior Publication Data

US 2009/0187803 A1 Jul. 23, 2009

Related U.S. Application Data

(60) Provisional application No. 61/022,364, filed on Jan. 21, 2008, provisional application No. 61/037,328, filed on Mar. 18, 2008.

(51) Int. Cl.
*H03M 13/00* (2006.01)
(52) U.S. Cl. ........................................ 714/752
(58) Field of Classification Search ............... 714/752
See application file for complete search history.

(56) References Cited

U.S. PATENT DOCUMENTS

| 4,845,713 | A | | 7/1989 | Zook |
| 5,267,242 | A | * | 11/1993 | Lavallee et al. ............... 714/6.32 |
| 5,553,231 | A | * | 9/1996 | Papenberg et al. ........... 714/5.11 |
| 6,047,395 | A | | 4/2000 | Zook |
| 6,353,909 | B1 | | 3/2002 | Amrany et al. |
| 6,385,751 | B1 | | 5/2002 | Wolf |
| 6,631,488 | B1 | | 10/2003 | Stambaugh et al. |
| 6,938,196 | B2 | | 8/2005 | Richardson et al. |
| 6,982,659 | B2 | | 1/2006 | Shen et al. |
| 7,475,103 | B2 | | 1/2009 | Novichkov et al. |
| 7,478,310 | B2 | | 1/2009 | Jung et al. |
| 2004/0123213 | A1 | * | 6/2004 | Welbon et al. ................. 714/752 |
| 2007/0198895 | A1 | | 8/2007 | Paumier et al. |
| 2008/0172592 | A1 | | 7/2008 | Wehn et al. |
| 2008/0198650 | A1 | | 8/2008 | Shalvi et al. |
| 2009/0024905 | A1 | | 1/2009 | Shalvi et al. |
| 2009/0070659 | A1 | | 3/2009 | Zhong et al. |
| 2009/0077449 | A1 | | 3/2009 | Lee |

(Continued)

FOREIGN PATENT DOCUMENTS

WO 2007052991 A1 5/2007

(Continued)

OTHER PUBLICATIONS

Chase, D., "A Class of Algorithms for Decoding Block Codes with Channel Measurement Information", IEEE Transactions on Information Theory, vol. IT-18, No. 1, pp. 170-182, Jan. 1972.

(Continued)

*Primary Examiner* — M. Mujtaba K Chaudry
*Assistant Examiner* — Enam Ahmed
(74) *Attorney, Agent, or Firm* — Meyertons, Hood, Kivlin, Kowert & Goetzel, P.C.

(57) ABSTRACT

A method includes receiving an Error Correction Code (ECC) code word, which includes multiple encoded bits that represent data and have a bit order. Multiple subsets of the encoded bits are selected using a selection criterion that does not sequentially follow the bit order. For each subset in at least some of the multiple subsets, the bits in the subset are inverted and the code word having the inverted bits is decoded, so as to reconstruct the data.

28 Claims, 3 Drawing Sheets

U.S. PATENT DOCUMENTS

| | | | |
|---|---|---|---|
| 2009/0094470 A1 | 4/2009 | Gao et al. | |
| 2009/0106485 A1 | 4/2009 | Anholt et al. | |
| 2009/0199074 A1 | 8/2009 | Sommer | |
| 2009/0249159 A1 | 10/2009 | Lee et al. | |
| 2009/0282320 A1 | 11/2009 | Liao et al. | |
| 2010/0306626 A1* | 12/2010 | Keays et al. | 714/777 |

FOREIGN PATENT DOCUMENTS

| | | | |
|---|---|---|---|
| WO | 2007132453 A2 | 11/2007 | |
| WO | 2007132457 A2 | 11/2007 | |
| WO | 2008026203 A2 | 3/2008 | |
| WO | 2008053472 A2 | 5/2008 | |
| WO | 2008139441 A2 | 11/2008 | |
| WO | 2009053961 A2 | 4/2009 | |
| WO | 2009072103 A2 | 6/2009 | |
| WO | 2009072105 A2 | 6/2009 | |
| WO | 2009074979 A2 | 6/2009 | |

OTHER PUBLICATIONS

Blahut, R.E., "Theory and Practice of Error Control Codes", chapter 6, sections 6.1-6.3, pp. 130-140, Addison-Wesley Publishing Company, Inc., USA, 1983.

Blahut, R.E., "Algebraic Codes for Data Transmission", chapter 6, pp. 131-166, and chapter 7, pp. 179-190, 217-233, Cambridge University Press, UK, 2004.

Chien, R.T., "Cyclic Decoding Procedures for Bose-Chaudhuri-Hocquenghem Codes", IEEE Transactions on information Theory, vol. IT-10, pp. 357-363, Oct. 1964.

Lin et al., "Error control coding: fundamentals and applications", chapter 6, pp. 209-215, and chapter 7, pp. 241-255, 2nd edition, Pearson Education, Inc., USA, 2004.

Anholt et al., U.S. Appl. No. 12/419,304 "High-Perfomiance ECC Decoder", filed Apr. 7, 2009.

Anholt et al., U.S. Appl. No. 12/728,289 "Dual ECC Decoder", filed Mar. 22, 2010.

Forney. D.G., "Generalized Minimum Distance Decoding", IEEE Transactions on Information Theory, vol. IT-12, No. 2, pp. 125-131, Apr. 1966.

Sharon et al., "Efficient Serial Message-Passing Schedules for LDPC Decoding", IEEE Transactions on Information Theory, vol. 53, No. 11, pp. 4076-4091, Nov. 2007.

Wu et al., "Parallel Weighted Bit-Flipping Decoding", IEEE Communicaton Letters, vol. 11, No. 8, pp. 671-673, Aug. 2007.

Lin et al., "Error control coding fundamentals and applications", chapter 17.6, pp. 871-880, 2nd edition, Pearson Education, Inc., USA, 2004.

Gallager, R.G., "Low-Density Parity-Check Codes", IRE Transactions on Information Theory, pp. 21-28, Jan. 1962.

Gallagher, R.G., "Low-Density Parity-Check Codes", Cambridge, USA, Jul. 1963.

Bez et al., "Introduction to Flash memory", Proceedings of the IEEE, vol. 91, No. 4, pp. 489-502, Apr. 2003.

Eitan et al., "Multilevel Flash Cells and their Trade-Offs", Proceedings of the 1996 IEEE International Electron Devices Meeting (IEDM), pp. 169-172, New York, USA 1996.

Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.

Mayan et al., "A 512 Mb NROM Flash Data Storage Memory with 8 MB/s Data Rate" Proceedings of the 2002 IEEE International Solid-State circuits Conference (ISSCC 2002), pp. 100-101, San Francisco, USA, Feb. 3-7, 2002.

Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.

Blahut, R., "Algebraic Codes for Data Transmission", Chapter 3.6, pp. 62-63, Cambridge University Press 2003.

Chen et al., "Small Area Parallel Chien Search Architectures for Long BCH Codes", IEEE Transactions on Very Large Scale Integration (VLSI) Systems, vol. 12, No. 5, pp. 656-549, May 2004.

Ha et al., "Rate-Compatible Punctured Low Density Parity Check Codes with Short Block Lengths", IEEE Transactions on Information Theory, vol. 52, No. 2, pp. 728-738, Feb. 2006.

Han et al., "An Efficient Dynamic Schedule for Layered Belief-Propagation Decoding of LDPC Codes", IEEE Communication Letters, vol. 13, No. 12, pp. 950-952, Dec. 2009.

IEEE Standard 802.11n-2009 "IEEE Standard for Information Technology—Telecommunications and Information Exchange Between Systems—Local and Metropolitan Area Networks—Specific Requirements Part 11: Wireless LAN Medium Access Control (MAAC) and Physical Layer (PHY) Specifications", Oct. 29, 2009.

Kim et al., "Design of Rate-Compatible Irregular LDPC Codes for Incremental Redundancy Hybrid ARQ Schemes", IEEE International Symposium on Information Theory (ISIT), pp. 1139-1143, Seattle, USA, Jul. 2006.

Kou et al., "Low Density Parity Check Codes Based on Finite Geometries: A Rediscovery and New Results", IEEE Transactions on Information Theory, vol. 47, No. 7, pp. 2711-2736, Nov. 2001.

Li et al., "Rate-Compatible Low Density Parity Check Codes for Capacity-Approaching ARQ Schemes in Packet Data Communications", Proceedings of the International Conference on Communications, Internet and Information Technology (CIIT), U.S. Virgin Islands, Nov. 2002.

Yazdani et al., "On Construction of Rate-Compatible Low-Density Parity-Check Codes", IEEE Communication Letters, vol. 8, No. 3, pp. 159-161, Mar. 2004.

U.S. Appl. No. 12/843,029 "Efficient LDPC codes", filed Jul. 25, 2010.

U.S. Appl. No. 12/797,615 "Chien search using multiple basis representation", filed Jun. 10, 2010.

Darabiha et al., "Power Reduction Techniques for LDPC Decoders", IEEE Journal of Solid-State Circuits, vol. 43, No. 8, pp. 1835-1845, Aug. 2008.

Whiting, D.L., "Bit-Serial Reed-Solomon Decoders in VLSI", Doctor Thesis, California Institute of Technology, Aug. 22, 1984.

\* cited by examiner

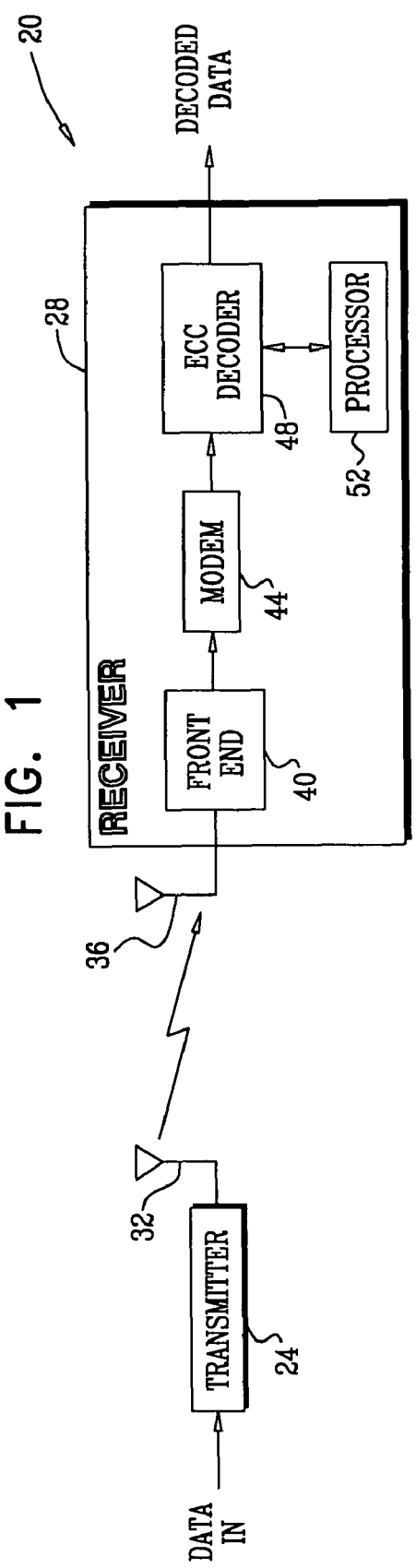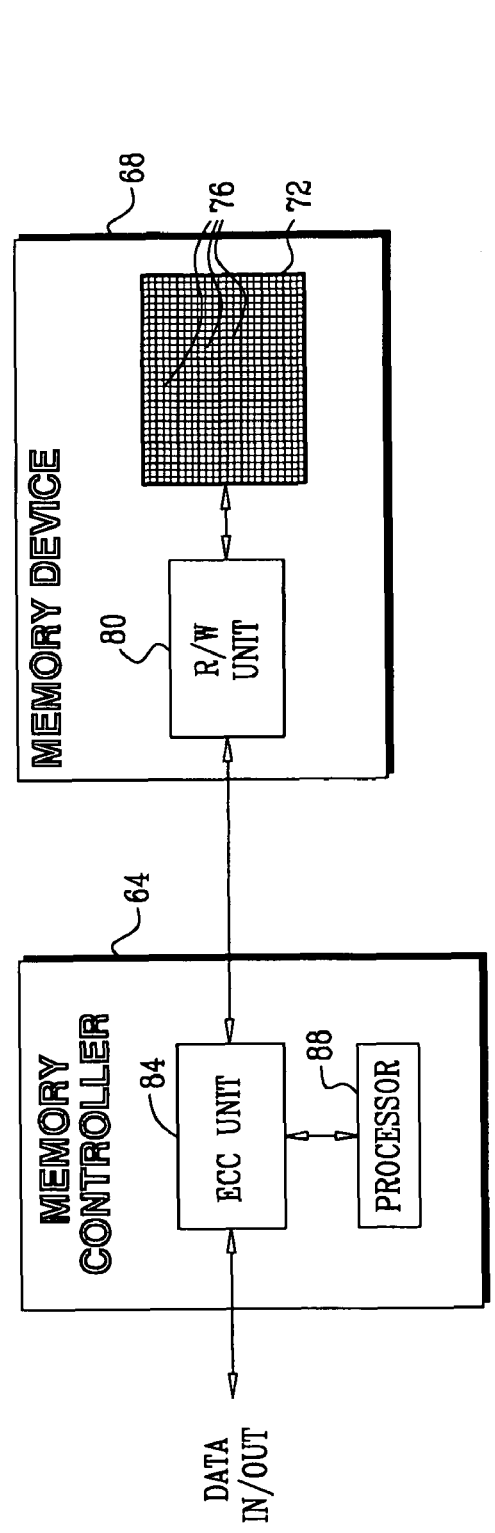

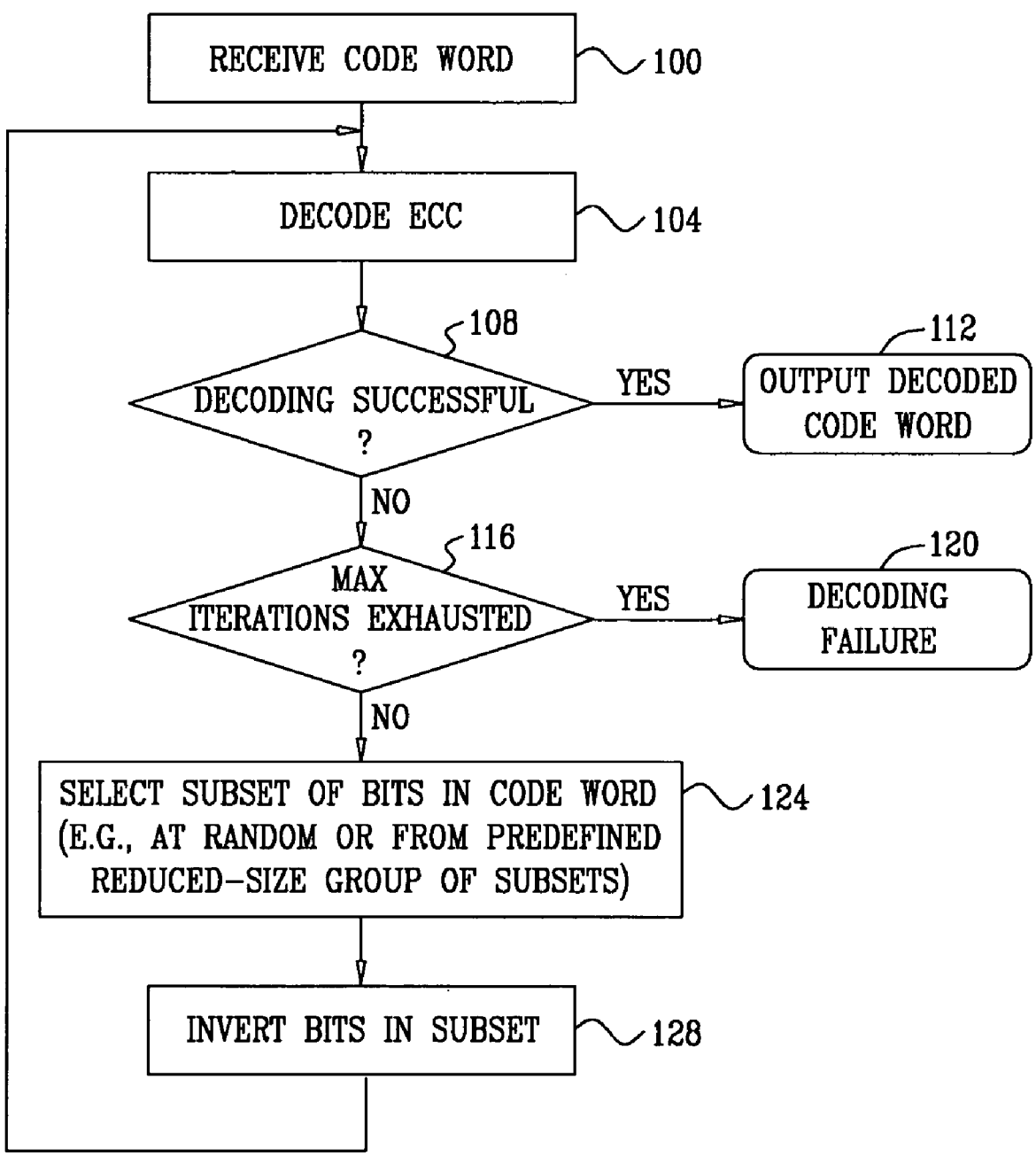

DECODING OF ERROR CORRECTION CODE USING PARTIAL BIT INVERSION

CROSS-REFERENCE TO RELATED APPLICATIONS

This application claims the benefit of U.S. Provisional Patent Application 61/022,364, filed Jan. 21, 2008, and U.S. Provisional Patent Application 61/037,328, filed Mar. 18, 2008, whose disclosures are incorporated herein by reference.

FIELD OF THE INVENTION

The present invention relates generally to Error Correction Codes (ECC), and particularly to methods and systems for enhancing ECC decoding performance.

BACKGROUND OF THE INVENTION

Error Correction Codes (ECC) are used in a variety of applications, such as in various digital communication and data storage applications. Many ECC decoding schemes are known in the art. For example, Chase describes algorithms that utilize channel measurement information, in addition to the conventional use of the algebraic properties of the code, in "A Class of Algorithms for Decoding Block Codes with Channel Measurement Information," IEEE Transactions on Information Theory, Volume IT-18, No. 1, January, 1972, pages 170-182, which is incorporated herein by reference.

SUMMARY OF THE INVENTION

An embodiment of the present invention provides a method, including:

receiving an Error Correction Code (ECC) code word, which includes multiple encoded bits that represent data and have a bit order;

selecting multiple subsets of the encoded bits using a selection criterion that does not sequentially follow the bit order; and for each subset in at least some of the multiple subsets, inverting the bits in the subset and decoding the code word having the inverted bits, so as to reconstruct the data.

In some embodiments, selecting the multiple subsets includes selecting the encoded bits in each of the subsets at random. Selection of the subsets and inversion of the bits may be performed responsively to an initial failure to decode the code word. In a disclosed embodiment, selecting the multiple subsets includes identifying some of the encoded bits as suspect bits that are suspected of causing the failure, and selecting the subsets from among the suspect bits. Identifying the suspect bits may include receiving respective confidence levels for at least some of the encoded bits, and identifying the encoded bits whose confidence levels are lower than a given threshold as the suspect bits.

In an embodiment, receiving the code word includes receiving a communication signal carrying the encoded bits, extracting the encoded bits from the communication signal, and providing the encoded bits to an ECC decoder so as to decode the code word. In an alternative embodiment, receiving the code word includes reading from a memory device data values carrying the encoded bits, extracting the encoded bits from the data values, and providing the encoded bits to an ECC decoder so as to decode the code word.

In some embodiments, the selection criterion is based on a distance metric defined among the subsets. In an embodiment, selecting the multiple subsets includes choosing a binary block code having multiple code words, and defining each selected subset of the encoded bits based on a respective code word of the binary block code. In some embodiments, selecting the multiple subsets includes representing the subsets by respective binary numbers, each having multiple bits, such that each bit in a given binary number representing a given subset corresponds to a respective encoded bit and indicates whether the respective encoded bit belongs to the given subset, and selecting the subsets that are represented by the code words of the binary block code. In an embodiment, the binary block code includes a Golay code.

In another embodiment, receiving the code word includes assigning respective soft reliability measures of the encoded bits, and decoding the code word includes decoding the code word responsively to the reliability measures. In yet another embodiment, inverting the bits in the subset includes reversing the respective reliability measures assigned to the bits in the subset. In still another embodiment, assigning the reliability measures includes marking some of the encoded bits as erasures, and selecting the multiple subsets includes selecting the subsets from among the encoded bits marked as the erasures.

There is additionally provided, in accordance with an embodiment of the present invention, apparatus, including:

An Error Correction Code (ECC) decoder, which is coupled to decode an Error Correction Code (ECC) code word, which includes multiple encoded bits that represent data and have a bit order; and a processor, which is coupled to select multiple subsets of the encoded bits using a selection criterion that does not sequentially follow the bit order, and, for each subset in at least some of the multiple subsets, to invert the bits in the subset and cause the ECC decoder to decode the code word having the inverted bits, so as to reconstruct the data.

The present invention will be more fully understood from the following detailed description of the embodiments thereof, taken together with the drawings in which:

BRIEF DESCRIPTION OF THE DRAWINGS

FIG. 1 is a block diagram that schematically illustrates a communication system that employs error correction coding, in accordance with an embodiment of the present invention;

FIG. 2 is a block diagram that schematically illustrates a data storage system that employs error correction coding, in accordance with an embodiment of the present invention; and FIGS. 3 and 4 are flow charts that schematically illustrate methods for decoding an Error Correction Code (ECC), in accordance with embodiments of the present invention.

DETAILED DESCRIPTION OF EMBODIMENTS

Overview

Figure 4:
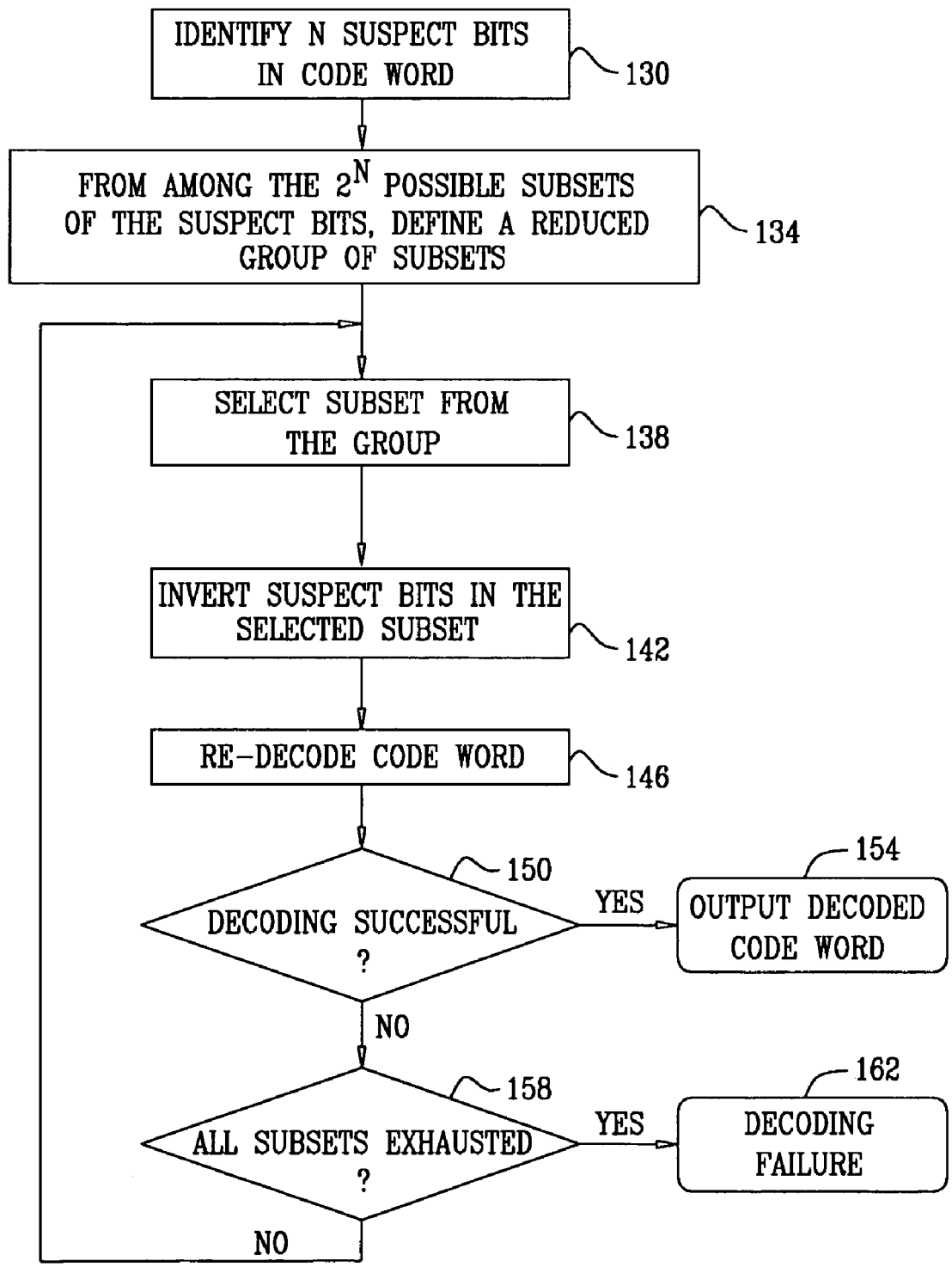

A given Error Correction Code (ECC) decoder typically has a certain correction capability, i.e., a maximum number of errors that it can correct per code word. Embodiments of the present invention provide methods and systems that improve the correction capability of an ECC decoder by selectively inverting code word bits.

In some embodiments, an ECC decoding system comprises an ECC decoder and a processor. The system accepts a code word, which comprises multiple encoded bits. The processor selects subsets of the encoded bits in accordance with a certain selection criterion. For each selected subset, the processor inverts the values of the bits in the subset to produce a modified code word, and the ECC decoder attempts to decode the modified code word. Typically, the process continues until decoding is successful or until reaching a pre-defined maximum number of iterations.

Several possible criteria for selecting subsets of encoded bits for inversion are described herein. The selection criteria described herein do not exhaustively select subsets of encoded bits by following the order of the encoded bits sequentially. In some embodiments, the processor selects partial subsets of the encoded bits at random. In alternative embodiments, the processor uses a predefined selection of a reduced-size group of subsets of the encoded bits. The reduced-size group is typically defined to be well representative of the entire group of subsets, even though it has a considerably smaller size. For example, a certain distance metric can be defined over the subsets, and the reduced-size group is defined so as to maximize the distances between the subsets in the group.

In one embodiment that is described herein, the reduced-size group of subsets is chosen by representing each subset of the encoded bits by a binary number. When the total number of encoded bits is N, each subset is represented by an N-bit binary number, whose respective bits correspond to the encoded bits. In a given binary number that represents a given subset, each bit value indicates whether the corresponding encoded bit belongs to the subset or not. Using this representation, the task of selecting the reduced-size group of subsets is translated to an equivalent task of selecting a group of binary numbers having large mutual distances. In some embodiments, the group of binary numbers is chosen to be a group of code words of a certain binary block code, such as a Golay code.

The methods and systems described herein are highly efficient in modifying un-decodable code words into code words that can be decoded successfully by the ECC decoder. For a given number of iterations, the disclosed methods have a much higher probability of success, in comparison with methods that exhaustively search the entire group of subsets of the encoded bits. Thus, for a given number of iterations, the disclosed methods can operate successfully on large numbers of bits. As such, the disclosed methods and systems can considerably improve the ECC decoding performance of various communication and storage systems.

System Description

Embodiments of the present invention provide improved methods and systems for decoding Error Correction Codes (ECC). The disclosed techniques can be used in a wide variety of systems and applications in which ECC is deployed, such as in various communication and data storage systems. FIGS. 1 and 2 below illustrate two example applications.

FIG. 1 is a block diagram that schematically illustrates a wireless communication system 20 that employs error correction coding, in accordance with an embodiment of the present invention. System 20 comprises a transmitter 24, which transmits data to a receiver 28. The transmitter accepts input data, encodes the data with a certain ECC, modulates the encoded data in accordance with a certain modulation scheme, converts the modulated digital signal to an analog signal, up-converts the analog signal to a suitable Radio frequency (RF), and transmits the RF signal toward the receiver using a transmit antenna 32.

In receiver 28, a receive antenna 36 receives the RF signal and provides it to a RF front end 40. The front end down-converts the RF signal to baseband or to a suitable Intermediate Frequency (IF), and digitizes the signal with a suitable Analog to Digital Converter (ADC—not shown in the figure). The digitized signal carrying the ECC-encoded data is demodulated by a modem 44, and the ECC is decoded by an ECC decoder 48. The performance of decoder 48 is enhanced by a processor 52, using methods that are described in detail below. By decoding the ECC, decoder 48 reconstructs the data that was input to transmitter 24. The reconstructed data is provided as the receiver output.

System 20 may comprise, for example, a cellular system, a satellite system, a point-to-point communication link, or any other suitable communication system that employs ECC. Although the example of FIG. 1 refers to a wireless communication system, the techniques described herein can be used with wire-line communication systems, such as cable communication systems, as well.

FIG. 2 is a block diagram that schematically illustrates a data storage system 60 that employs error correction coding, in accordance with an alternative embodiment of the present invention. System 60 comprises a memory controller 64, which stores data in a memory device 68. The memory device comprises an array 72 comprising multiple memory cells 76. Array 72 may comprise any suitable type of volatile or non-volatile memory, such as, for example, Random Access Memory (RAM) or Flash memory. Alternatively, device 68 may comprise a magnetic storage device such as a Hard Disk Drive (HDD), or any other suitable storage medium. System 60 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

Memory device 68 comprises a Read/Write (R/W) unit 80, which writes data values into memory cells 76 and reads data values from the memory cells. Memory controller 64 comprises an ECC unit 84, which encodes the data for storage with a certain ECC, and decodes the ECC of data that is retrieved from the memory cells. The performance of unit 84 in decoding the ECC is enhanced by a processor 88, using methods that are described in detail below. The ECC used in systems 20 and 60 may comprise, for example, a Low Density Parity Check (LDPC) code, a Bose-Chaudhuri-Hocquenghem (BCH) code, a Reed-Solomon (RS) code, or any other suitable type of ECC.

Processors 52 and 88, ECC decoder 48 and ECC unit 84 can be implemented in software, in hardware or using a combination of hardware and software elements. In some embodiments, processors 52 and 88 comprise general-purpose processors, which are programmed in software to carry out the functions described herein. The software may be downloaded to the processors in electronic form, over a network, for example, or it may, alternatively or additionally, be provided and/or stored on tangible media, such as magnetic, optical, or electronic memory.

The ECC decoding methods described herein can be used in communication systems such as system 20, as well as in data storage systems such as system 60. The description that follows applies to both communication applications and to storage applications, and refers to an ECC decoder and a processor. Any reference to The ECC decoder applies to decoder 48 of system 20, as well as to the decoder functionality of unit 84 in system 60. Any reference to The processor applies to processor 52 of system 20, as well as to processor 88 in system 60. Alternatively, the methods described herein can be carried out by any suitable element in any suitable system that involves ECC decoding.

Enhanced ECC Decoding Using Partial Bit Inversion

A given ECC typically operates on sets of bits, referred to as code words. In a typical encoding operation, the ECC encoder accepts k data bits and encodes them to produce a respective code word having n encoded bits, n>k. In a typical decoding operation, the ECC decoder accepts an n-bit code word and decodes it to reconstruct the k data bits. Each ECC can be characterized by its correction capability, i.e., by the maximum number of errors per code word that it is able to correct. In some practical cases, the number of erroneous encoded bits in a given code word exceeds the correction capability of the ECC, such as when the encoded bits suffer from a high level of distortion.

Embodiments of the present invention provide methods and systems for enhancing the ECC correction capability of the ECC decoder. In the description that follows, the methods and systems described herein are invoked upon a failure of the ECC decoder to decode a given code word. (As such, these methods and systems are particularly suitable for use with ECC decoding schemes in which the decoder declares some n-bit vectors as undecodable. Such schemes are sometimes referred to as incomplete decoding schemes.) Generally, however, the methods and systems described herein can be applied regardless of an initial ECC decoding failure.

In response to an initial ECC decoding failure, the processor selects a certain subset of the encoded bits in the code word, inverts the values of these bits, and re-attempts to decode the code word having the inverted bits using the ECC decoder. Typically, the process is repeated until the ECC decoder succeeds in decoding the code word, or until reaching a predefined maximum number of iterations. Several example embodiments, which use various criteria for selecting the subset of bits to be inverted, are described below.

FIG. 3 is a flow chart that schematically illustrates a method for decoding an Error Correction Code (ECC), in accordance with an embodiment of the present invention. The method begins with the ECC decoder receiving a code word for decoding, at an input step 100. The code word comprises multiple encoded bits, and the ECC decoder or the processor receives respective confidence levels for at least some of the encoded bits along with the code word.

The processor instructs the ECC decoder to decode the code word, at a decoding step 104. The processor checks whether decoding was successful, at a success checking step 108. If successful, the ECC decoder or the processor outputs the decoded data bits, at a success termination step 112, and the method terminates.

If, on the other hand, the ECC decoding attempt failed, the processor checks whether a predefined maximum number of iterations has been exhausted, at an iteration checking step 116. If exhausted, the processor outputs a failure notification, at a failure termination step 120, and the method terminates.

If the maximum number of iterations is not yet exhausted, the processor selects a subset of the encoded bits in the code word, at a subset selection step 124. The processor inverts the values of the bits in the subset (i.e., replaces each "1" bit value with a "0" bit value, and vice versa) to produce a modified code word, at an inverting step 128. The method then loops back to decoding step 104 above, in which the ECC decoder re-attempts to decode the code word having the inverted bits.

The ECC decoder will succeed in decoding the modified code word if the bit inversion process reduced the number of erroneous encoded bits below the correction capability of the ECC. The iterations continue until a successful combination is found, or until the maximum number of iterations is reached.

The processor may apply any suitable criterion for selecting the subset of bits to be inverted in each iteration. For example, in some embodiments, different encoded bits in the code word have different confidence levels. In other words, the processor may have certain side information, which indicates that some encoded bits are more likely to be erroneous than others. Such encoded bits are referred to herein as suspect bits, since they are suspected of having caused the ECC decoding failure. For example, the processor may regard any encoded bit whose confidence level is below a certain threshold as a suspect bit.

The confidence levels of the encoded bits can be obtained using any suitable technique. In communication applications, for example, the modem may measure the Signal-to-Noise Ratio (SNR) at which each encoded bit is received, and translate the SNRs into confidence levels. As another example, in storage applications, the memory controller may estimate the levels of distortion that affect each encoded bit retrieved from memory. Methods for estimating the distortion level are described, for example, in PCT International Publication WO/2007/132453, entitled "Distortion Estimation and Cancellation in Memory Devices," which is assigned to the assignee of the present patent application and whose disclosure is incorporated herein by reference.

In some embodiments, the processor inverts a different subset of the suspect bits in each iteration of the method of FIG. 3. It is possible in principle to exhaustively scan all the possible subsets of the suspect bits. The complexity of this process, however, grows exponentially with the number of suspect bits, and is therefore practical only for a very small number of suspect bits. Marking only a small number of encoded bits as suspects reduces the likelihood of success considerably, since the probability of finding a sufficient number of actual errors within a small number of suspect bits is low.

Therefore, in a disclosed embodiment, the processor marks a larger number of bits as suspects, and selects the suspect bits for inversion at random in each iteration. In a given iteration, the processor may select the suspect bits for inversion by randomly selecting bits with a certain probability p from among all the suspect bits. Alternatively, the processor may randomly select a partial group of M suspect bits, and invert all the bits in this subset.

For a given number of iterations, random selection of suspect bits for inversion has a considerably higher probability of success in comparison with exhaustive search. In other words, given a certain maximum number of iterations, given a code word having a certain number of encoded bits that are erroneous, and given an ECC having a certain correction capability, the likelihood of the random selection process to produce a modified code word that can be corrected by the ECC decoder is considerably higher than that of an exhaustive search process.

Although the description above refers to random selection of bits for inversion from among a set of suspect bits, the method of FIG. 3 can also be carried out without identification of suspect bits. For example, bits for inversion may be selected at random from the entire code word, or from another suitable subset of the encoded bits.

For N suspect bits, the total number of subsets of the suspect bits is $2^N$. In the description above, subsets of the suspect bits were selected at random and inverted. In alternative embodiments, the processor defines a group of subsets, whose size is considerably smaller than the total number $2^N$. The processor then deterministically scans this group of subsets, and in each iteration inverts the suspect bits in the subset and re-attempts to decode the modified code word. This process is illustrated in FIG. 4 below.

The likelihood of success of this process depends on the selection of the subsets in the group. In order to provide good performance, the group of subsets should be representative of the entire set of $2^N$ subsets even though it has a much smaller size. In other words, the subsets in the group should be sufficiently different from one another.

A possible way to define such a group of subsets is to represent each subset by an N-bit binary number. The N bits of the binary number correspond to the N suspect bits identified in the code word. In this representation, the value of the $i^{th}$ bit of the binary number indicates whether or not the $i^{th}$ suspect bit of the code word belongs to the subset. For example, a "1" bit value of the $i^{th}$ bit of the binary number indicates that the $i^{th}$ suspect bit is part of the subset, and vice versa.

Consider, for example, a code word having one hundred encoded bits denoted b0 . . . b99. The four encoded bits b11, b15, b50 and b70 are assumed to be suspects. In total, there are $2^4$=16 possible subsets of the four suspect bits. Each of these subsets can be represented by a four-bit binary number. The first bit of this binary number indicates whether suspect bit b11 belongs to the subset. The second bit of the binary number indicates whether suspect bit b15 belongs to the subset, and so on. For example, the subset {b11,b50, b70} is represented by the binary number "1011".

A distance metric is defined among the N-bit binary numbers. The distance metric may comprise, for example, a Hamming distance or any other suitable metric. It can be shown that if a group of binary numbers is chosen so as to maximize the distance metrics among its members, then the corresponding group of subsets of the suspect bits has a high likelihood of producing a modified code word that is decodable by the ECC decoder.

In one embodiment, the group of binary numbers is defined as the code words of a certain binary block code. (It is important not to confuse this binary block code with the ECC whose code words are being decoded using the disclosed methods.) As is well known in the art, a well-designed binary block code has code words that are distant from one another in terms of Hamming distance or other distance metric.

Consider, for example, a scenario in which twenty-three suspect bits are marked in the code word (i.e., N=23). In such a scenario, the binary numbers can be selected to be the $2^{12}$ code words of a Golay [23,12,7] binary block code. This code is well distributed within the space of $2^{23}$-bit binary numbers, having a minimum Hamming distance of 3. The Golay [23, 12,7] code is often referred to as a perfect code, since it provides the smallest worst-case Hamming distance for its size within the space in question.

Alternatively, any other suitable binary block code can be chosen to serve as the group of binary numbers that represent the group of subsets of the suspect bits. Further alternatively, a reduced-size group of subsets of the suspect bits can be defined using any other suitable process or criterion.

Although the description that follows refers to selection of subsets of suspect bits, the methods described herein can also be carried out without identification of suspect bits. For example, the subsets may be selected at random from the entire code word, or from another suitable set of encoded bits.

FIG. 4 is a flow chart that schematically illustrates a method for decoding an Error Correction Code (ECC), in accordance with an embodiment of the present invention. The method begins with the processor identifying N suspect bits in the code word to be decoded, at a suspect identification step 130. As noted above, the processor receives confidence levels for at least some of the encoded bits, and identifies the suspect bits based on the confidence levels.

From among the $2^N$ possible subsets of the suspect bits, the processor defines a reduced group of subsets, at a reduced group definition step 134. The processor selects a subset from the group, at a subset selection step 138. The processor inverts the bits in the selected subset to produce a modified code word, at a subset inversion step 142. The processor then instructs the ECC decoder to decode the modified code word, at an ECC decoding step 146. The processor checks whether decoding was successful, at a decoding success checking step 150. If successful, the reconstructed data bits are provided as output, at a success step 154, and the method terminates.

If the ECC decoder failed in decoding the modified code word, the processor checks whether all subsets in the reduced-size group have been exhausted, at a termination checking step 158. If all the subsets have already been used, the processor outputs a failure indication, at a failure step 162, and the method terminates. Otherwise, i.e., if there are remaining subsets, the method loops back to step 138 above, in which the processor selects another subset of suspect bits from the reduced-size group.

In many practical cases, the operations performed by the ECC decoder in different iterations have certain commonality. Thus, in some embodiments, the ECC decoder may reuse in a given iteration information that was computed in a previous iteration. Reusing information that is common to two or more iteration reduces the computational complexity of the decoding process. The ECC decoder may reuse any suitable type of information, such as syndromes from one or more previous iterations. Typically, reusing syndromes does not involve storing the entire code word. This reuse feature can be used with any of the methods described herein, such as the methods of FIGS. 3 and 4 above.

In some embodiments, the ECC decoder comprises a soft decoder, which decodes the code word using soft reliability measures assigned to the encoded bits. For example, the reliability measures may comprise Log Likelihood Ratios (LLRs) of the encoded bits. Typically, a high positive LLR value (LLR>>0) indicates that the encoded bit is likely to be "0", a high negative LLR value (LLR<<0) indicates that the encoded bit is likely to be "1", and an LLR having a small absolute value indicates a non-reliable encoded bit.

When the decoder uses soft decoding, the processor may select the subsets of bits for inversion based on the reliability measures. For example, the bits for inversion can be selected at random from among a set of least-reliable encoded bits, as indicated by the reliability measures. As another example, the processor may select the K least-reliable encoded bits, and then scan and invert the $2^K$ bit value combinations of these bits.

For each selected bit combination, the processor reverses the reliability measures of the bits intended for inversion (i.e., for a bit that is currently "1" the processor assigns a reliability measure that indicates "0" with high likelihood, and vice versa). After reversing the reliability measures in this manner, the processor provides the reliability measures to the ECC decoder, and invokes the soft decoding process.

In some embodiments, the processor may have side information, which indicates that some encoded bits suffer from strong noise or interference. In a memory storage application, for example, a certain column of the memory may be stuck at a constant value. In such cases, the processor may regard these bits as candidates for inversion irrespective of their reliability measures (which do not take into account the side information).

In some embodiments, some of the encoded bits can be reported to the ECC decoder as erasures, and the ECC decoder decodes the code word while considering the marked erasures. Decoding using erasure indications is addressed, for example, by Forney in "Generalized Minimum Distance Decoding," IEEE Transactions on Information Theory, volume IT-12, issue 2, April, 1966, pages 125-131, which is incorporated herein by reference.

When some of the encoded bits are marked as erasures, it may be impractical to erase all of these bits in the decoding process. In some embodiments, the processor selects and reports to the ECC decoder only a subset of the bits marked as erasures. Typically, the processor runs an iterative process, such that in each iteration a different subset of the bits originally marked as erasures is reported as erasures to the decoder. The bits to be reported as erased can be selected at random or using any other suitable criterion.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method, comprising:
  receiving an Error Correction Code (ECC) code word, which comprises multiple encoded bits that represent data and have a bit order;
  selecting multiple subsets of the encoded bits using a selection criterion that does not sequentially follow the bit order; and
  for each subset in at least some of the multiple subsets, inverting the bits in the subset and decoding the code word having the inverted bits, so as to reconstruct the data.

2. The method according to claim 1, wherein selecting the multiple subsets comprises selecting the encoded bits in each of the subsets at random.

3. The method according to claim 1, wherein selection of the subsets and inversion of the bits is performed responsively to an initial failure to decode the code word.

4. The method according to claim 3, wherein selecting the multiple subsets comprises identifying some of the encoded bits as suspect bits that are suspected of causing the failure, and selecting the subsets from among the suspect bits.

5. The method according to claim 4, wherein identifying the suspect bits comprises receiving respective confidence levels for at least some of the encoded bits, and identifying the encoded bits whose confidence levels are lower than a given threshold as the suspect bits.

6. The method according to claim 1, wherein receiving the code word comprises receiving a communication signal carrying the encoded bits, extracting the encoded bits from the communication signal, and providing the encoded bits to an ECC decoder so as to decode the code word.

7. The method according to claim 1, wherein receiving the code word comprises reading from a memory device data values carrying the encoded bits, extracting the encoded bits from the data values, and providing the encoded bits to an ECC decoder so as to decode the code word.

8. The method according to claim 1, wherein the selection criterion is based on a distance metric defined among the subsets.

9. The method according to claim 1, wherein selecting the multiple subsets comprises choosing a binary block code having multiple code words, and defining each selected subset of the encoded bits based on a respective code word of the binary block code.

10. The method according to claim 9, wherein selecting the multiple subsets comprises:
  representing the subsets by respective binary numbers, each having multiple bits, such that each bit in a given binary number representing a given subset corresponds to a respective encoded bit and indicates whether the respective encoded bit belongs to the given subset; and
  selecting the subsets that are represented by the code words of the binary block code.

11. The method according to claim 9, wherein the binary block code comprises a Golay code.

12. The method according to claim 1, wherein receiving the code word comprises assigning respective soft reliability measures of the encoded bits, and wherein decoding the code word comprises decoding the code word responsively to the reliability measures.

13. The method according to claim 12, wherein inverting the bits in the subset comprises reversing the respective reliability measures assigned to the bits in the subset.

14. The method according to claim 12, wherein assigning the reliability measures comprises marking some of the encoded bits as erasures, and wherein selecting the multiple subsets comprises selecting the subsets from among the encoded bits marked as the erasures.

15. Apparatus, comprising:
  An Error Correction Code (ECC) decoder, which is coupled to decode an Error Correction Code (ECC) code word, which comprises multiple encoded bits that represent data and have a bit order; and
  a processor, which is coupled to select multiple subsets of the encoded bits using a selection criterion that does not sequentially follow the bit order, and, for each subset in at least some of the multiple subsets, to invert the bits in the subset and cause the ECC decoder to decode the code word having the inverted bits, so as to reconstruct the data.

16. The apparatus according to claim 15, wherein the processor is coupled to select the encoded bits in each of the subsets at random.

17. The apparatus according to claim 15, wherein the processor is coupled to select the subsets and invert the bits responsively to an initial failure of the ECC decoder to decode the code word.

18. The apparatus according to claim 17, wherein the processor is coupled to identify some of the encoded bits as suspect bits that are suspected of causing the failure, and to select the subsets from among the suspect bits.

19. The apparatus according to claim 18, wherein the processor is coupled to receive respective confidence levels for at least some of the encoded bits, and to identify the encoded bits whose confidence levels are lower than a given threshold as the suspect bits.

20. The apparatus according to claim 15, and comprising a communication receiver, which is coupled to receive a communication signal carrying the encoded bits, to extract the encoded bits from the communication signal, and to provide the encoded bits to the ECC decoder.

21. The apparatus according to claim 15, and comprising:
  a memory, which is operative to store data values carrying the encoded bits; and reading circuitry, which is coupled to read the data values from the memory device, to extract the encoded bits from the data values and to provide the encoded bits to the ECC decoder.

22. The apparatus according to claim 15, wherein the selection criterion is based on a distance metric defined among the subsets.

23. The apparatus according to claim 15, wherein the processor is coupled to accept a binary block code having multiple code words, and to define each selected subset of the encoded bits based on a respective code word of the binary block code.

24. The apparatus according to claim 23, wherein the processor is coupled to represent the subsets by respective binary numbers, each having multiple bits, such that each bit in a given binary number representing a given subset corresponds to a respective encoded bit and indicates whether the respective encoded bit belongs to the given subset, and to select the subsets that are represented by the code words of the binary block code.

25. The apparatus according to claim 23, wherein the binary block code comprises a Golay code.

26. The apparatus according to claim 15, wherein the ECC decoder is coupled to decode the code word responsively to respective soft reliability measures assigned to the encoded bits.

27. The apparatus according to claim 26, wherein the processor is coupled to reverse the respective reliability measures assigned to the bits in each selected subset.

28. The apparatus according to claim 15, wherein the ECC decoder is coupled to decode the code word responsively to an identification of some of the encoded bits as erasures, and wherein the processor is coupled to select the subsets from among the encoded bits identified as the erasures.

* * * * *